(12) United States Patent
Kim

(10) Patent No.: US 8,138,669 B2
(45) Date of Patent: Mar. 20, 2012

(54) DOUBLE-EMISSION ORGANIC LIGHT EMITTING DIODE DISPLAY DEVICE

(75) Inventor: Eun-Ah Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 422 days.

(21) Appl. No.: 12/361,916

(22) Filed: Jan. 29, 2009

(65) Prior Publication Data

US 2010/0013380 A1    Jan. 21, 2010

(30) Foreign Application Priority Data

Jul. 17, 2008 (KR) .......................... 10-2008-0069571

(51) Int. Cl.
*H01J 1/62* (2006.01)

(52) U.S. Cl. ........................................................ 313/505

(58) Field of Classification Search .................... 313/505
See application file for complete search history.

(56) References Cited

U.S. PATENT DOCUMENTS

| | | | | |
|---|---|---|---|---|
| 5,757,139 A * | 5/1998 | Forrest et al. | ............... | 315/169.3 |
| 6,337,492 B1 * | 1/2002 | Jones et al. | ...................... | 257/40 |
| 6,537,688 B2 * | 3/2003 | Silvernail et al. | ............. | 428/690 |
| 7,106,001 B2 * | 9/2006 | Kim et al. | ...................... | 313/512 |
| 7,164,151 B2 * | 1/2007 | Yamazaki et al. | ............... | 257/52 |
| 7,514,861 B2 * | 4/2009 | Chang et al. | ................... | 313/504 |
| 7,687,983 B2 * | 3/2010 | Lee et al. | ........................ | 313/503 |
| 2006/0006792 A1 * | 1/2006 | Strip | ............................ | 313/500 |
| 2006/0066236 A1 * | 3/2006 | Tanaka et al. | ................. | 313/512 |
| 2007/0080629 A1 * | 4/2007 | Ko | ................................. | 313/504 |
| 2007/0114916 A1 * | 5/2007 | Chang et al. | ................... | 313/504 |
| 2007/0120478 A1 * | 5/2007 | Lee et al. | ...................... | 313/512 |
| 2007/0138941 A1 | 6/2007 | Jin et al. | | |
| 2010/0252825 A1 * | 10/2010 | Yamazaki et al. | .............. | 257/40 |

FOREIGN PATENT DOCUMENTS

| | | |
|---|---|---|
| CN | 1489422 A | 4/2004 |
| EP | 1 391 945 A2 | 2/2004 |
| JP | 8-153586 | 6/1996 |
| JP | 10-12380 | 1/1998 |
| JP | 2000-100560 A | 4/2000 |
| JP | 2004-55565 A | 2/2004 |

(Continued)

OTHER PUBLICATIONS

Korean Office Action issued on Aug. 30, 2006 in the corresponding Korean Patent Application No. 10-2005-0035728.

(Continued)

*Primary Examiner* — Peter Macchiarolo
(74) *Attorney, Agent, or Firm* — Robert E. Bushnell, Esq.

(57) ABSTRACT

A double-emission organic light emitting diode (OLED) display device to display images on both sides includes two substrates each having an independently-drivable OLED bonded to each other to prevent breakage due to external pressure and decrease power consumption. The OLED display device includes a first substrate, a first OLED disposed on the first substrate and having at least one first emission layer, a conductive layer disposed on the first OLED, a second OLED disposed on the conductive layer and having at least one second emission layer, and a second substrate disposed on the second OLED. Alternatively, the OLED display device includes a sealant disposed along edges of the first and second substrates to bond the first substrate to the second substrate, and a conductive filler disposed between the first and second substrates.

24 Claims, 2 Drawing Sheets

FOREIGN PATENT DOCUMENTS

| | | | |
|---|---|---|---|
| JP | 2004-327416 | A | 11/2004 |
| JP | 2005-71693 | A | 3/2005 |
| JP | 2005-84642 | A | 3/2005 |
| JP | 2005-347677 | | 12/2005 |
| JP | 2007-171932 | | 7/2007 |
| KR | 2004-15507 | | 2/2004 |
| KR | 10-2006-0023271 | | 3/2006 |
| KR | 10-2006-0023652 | | 3/2006 |
| KR | 2006-57446 | | 5/2006 |
| KR | 2006-112963 | | 11/2006 |
| KR | 2007-105082 | | 10/2007 |

OTHER PUBLICATIONS

Korean Decision of Grant issued on Jul. 16, 2007 in the corresponding Korean Patent Application No. 10-2005-0035728.

Chinese Office Action issued on Jul. 11, 2008 in the corresponding Chinese Patent Application No. 200610074878.5.

Japanese Office Action issued on Dec. 9, 2008 in corresponding Japanese Patent Application No. 2005-361050.

US Office Action issued on Jul. 8, 2009 in the corresponding U.S. Appl. No. 11/408,693.

\* cited by examiner

DOUBLE-EMISSION ORGANIC LIGHT EMITTING DIODE DISPLAY DEVICE

CROSS-REFERENCE TO RELATED APPLICATIONS

This application claims the benefit of Korean Patent Application No. 2008-69571, filed Jul. 17, 2008, the disclosure of which is hereby incorporated herein by reference.

BACKGROUND OF THE INVENTION

1. Field of the Invention

Aspects of the present invention relate to an organic light emitting diode (OLED) display device, and more particularly, to a double-emission OLED display device which has two bonded substrates including independently-drivable OLEDs, respectively, and displays images at double sides, in such a way that breakage by external impact and power consumption can be reduced.

2. Description of the Related Art

Cathode-ray tube display devices are being replaced by flat panel display devices that are light and compact. The flat panel display devices include liquid crystal display (LCD) devices and organic light emitting diode (OLED) display devices. Among them, the OLED display devices have excellent brightness and a wide viewing angle. Further, the OLED display devices do not need a backlight unit and can be manufactured in a very compact size.

The OLED display device is a display device which emits light of a specific wavelength when electrons and holes combine with each other in an organic thin layer from a cathode and an anode to create excitons, and the excitons transition from an excited state to a ground state.

The OLED display device may be classified into a passive matrix OLED display device and an active matrix OLED display device depending on the driving method. The active matrix OLED display device has a circuit using a thin film transistor (TFT). The passive matrix OLED display device may be fabricated using a simple process since anodes and cathodes are arranged in a matrix on a display region. However, the passive matrix OLED display device is generally applied only to low-resolution, small-sized display devices due to the resolution limit, a high driving voltage, and short lifetimes of materials. In the active matrix OLED display device, a display region includes a thin film transistor for each pixel, and an equal amount of current is applied to the pixels, so that uniform brightness can be obtained. Moreover, the active matrix OLED display device may be used as a high-resolution large-sized display due to low power consumption.

Further, the OLED display device may include independently-drivable OLEDs formed on respective substrates to display different images in opposite directions. However, such a double-emission organic light emitting diode (OLED) display device includes two substrates having independently-drivable OLEDs, respectively. Here, the substrates are bonded to allow OLEDs to be spaced apart from each other. Because of such a structure, the OLEDs can be easily broken by pressure externally applied to the substrate in a vertical direction. Moreover, for independent drive, each OLED has a power voltage line, and thus the OLED display device has a complicated arrangement of interconnections and increased power consumption.

SUMMARY OF THE INVENTION

Aspects of the present invention provide a double-emission organic light emitting diode (OLED) display device which can decrease a space between two substrates having independently-drivable OLEDs and decrease an IR drop in a power voltage line delivering a power voltage to each OLED.

According to an embodiment of the present invention, an OLED display device includes: a first substrate; a first OLED disposed on the first substrate and having at least one first emission layer; a conductive layer disposed on the first OLED; a second OLED disposed on the conductive layer and having at least one second emission layer; and a second substrate disposed on the second OLED.

According to another embodiment of the present invention, an OLED display device includes: a first substrate including a first OLED having at least one first emission layer; a second substrate bonded to the first substrate and including a second OLED having at least one second emission layer; a sealant disposed along edges of the first and second substrates to bind the first substrate to the second substrate; and a conductive filler disposed between the first and second substrates.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
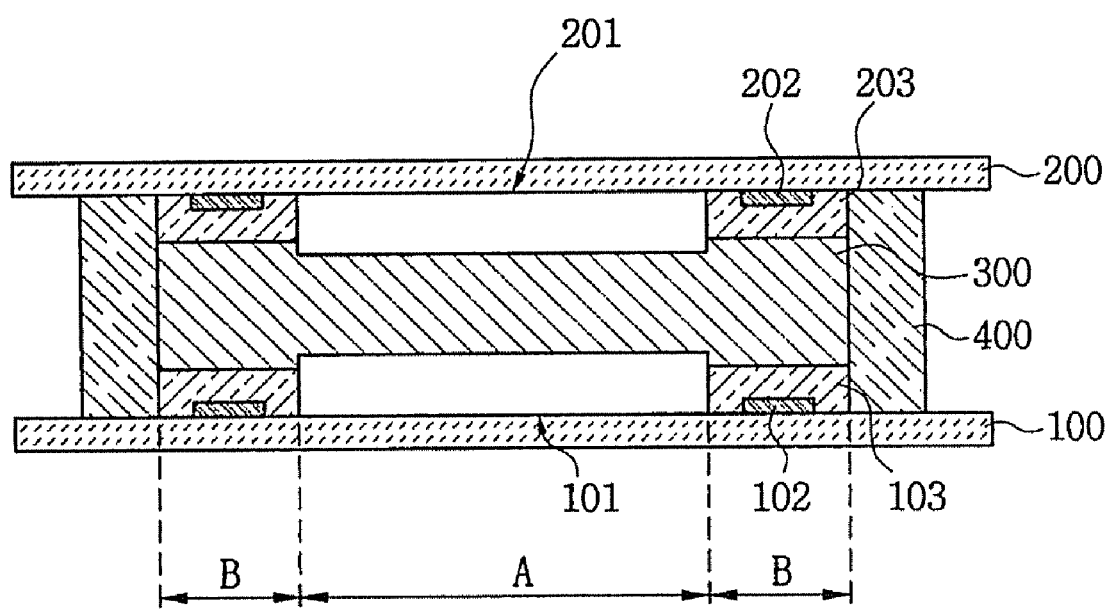
FIG. 1 is a schematic cross-sectional view of a double-emission organic light emitting diode (OLED) display device according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures. Accordingly, the drawings and description are to be regarded as illustrative in nature and not restrictive. In addition, when an element is referred to as being "on," "formed on," or "disposed on" another element, it can be directly on, formed directly on, or disposed directly on another element or one or more intervening elements may be disposed therebetween. Also, when an element is referred to as being "connected to," "coupled to," "electrically coupled to," or "electrically connected to" another element, it can be directly connected to another element or be indirectly connected to another element with one or more intervening elements interposed therebetween.

FIG. 1 is a schematic cross-sectional view of a double-emission organic light emitting diode (OLED) display device according to an exemplary embodiment of the present invention. Referring to FIG. 1, an OLED display device includes a first substrate 100 and a second substrate 200, both of which have a display region A and an interconnection region B and face each other. A first OLED 101 is disposed on the display region A of the first substrate 100 and has at least one first emission layer (not shown). A second OLED 201 is disposed on the display region A of the second substrate 200 and is disposed to face the first substrate 100 and has at least one second emission layer (not shown). The first and second OLEDs 101 and 201 are disposed on respective sides that face each other of the first and second substrates 100 and 200, i.e., the first and second OLEDs 101 and 201 are disposed on the first and second substrates 100 and 200 and between the first and second substrates 100 and 200. A sealant 400 is disposed along edges of the first and second substrates 100 and 200, and between the first substrate 100 and the second substrate 200 so as to bond the first and second substrates 100 and 200 together. A conductive filler 300 is disposed between the first and second substrates 100 and 200. Here, the conductive filler 300 may include conductive powder comprising metal or carbon, and a solid conductive film, such as an anisotropic conductive film (ACF).

A space between the first and second substrates 100 and 200 is fully filled with the conductive filler 300. When a solid conductive film, such as an anisotropic conductive film (ACF), is used as the conductive filler 300, the solid conductive film may be disposed only between the first OLED 101 and the second OLED 201. When a paste including conductive metal or carbon powder is used as the conductive filler 300, a conductive layer may be formed between the first OLED 101 and the second OLED 201.

The first OLED 101 includes a first lower electrode (not shown) disposed between the first substrate 100 and the first emission layer, and a first upper electrode (not shown) disposed between the first emission layer and the conductive filler 300. The second OLED 201 includes a second lower electrode (not shown) disposed between the second substrate 200 and the second emission layer, and a second upper electrode (not shown) disposed between the second emission layer and the conductive filler 300. The first and second upper electrodes are in contact with the conductive filler 300. The first upper electrode of the first OLED 101 is electrically connected to the second upper electrode of the second OLED 201, and thus voltages having the same polarity are applied to these electrodes of the first and second OLEDs 101 and 201. For this reason, the first upper electrode of the first OLED 101 and the second upper electrode of the second OLED 201 may be formed of the same material.

At least one thin film transistor (not shown) may be formed between the first lower electrode of the first OLED 101 and the first substrate 100 and/or between the second lower electrode of the second OLED 201 and the second substrate 100, and a passivation layer (not shown) may be formed to prevent unnecessary electrical connection between the thin film transistor and the first or second lower electrode.

In addition, each of the first and second OLEDs 101 and 201 includes at least one emission region (not shown). The emission regions of the first OLED 101 and the second OLED 201 may overlap each other, or the emission region of the first OLED 101 may overlap a non-emission region of the second OLED 201.

At least one interconnection 102 or 202 may be formed in one or both interconnection regions B of the first and second substrates 100 and 200 to drive the first and second OLEDs 101 and 201. Here, an interconnection insulating layer 103 or 203 is formed to insulate the at least one interconnection 102 or 202 from the conductive filler 300.

Here, the interconnection insulating layer 103 or 203 may be an organic layer, an inorganic layer, or a combination thereof. When the thin film transistor is formed between the first lower electrode of the first OLED 101 and the first substrate 100 or between the second electrode of the second OLED 201 and the second substrate 200, the interconnection insulating layer 203 may be one selected from the group consisting of a gate insulating layer, an interlayer insulating layer, which are included in the thin film transistor, and a passivation layer formed on the thin film transistor, and combinations thereof.

Further, an absorption layer (not shown) may be disposed between the interconnection insulating layer 103 or 203 and the conductive filler 300 to prevent degradation of the first and second OLEDs due to moisture introduced from outside.

Figure 2:
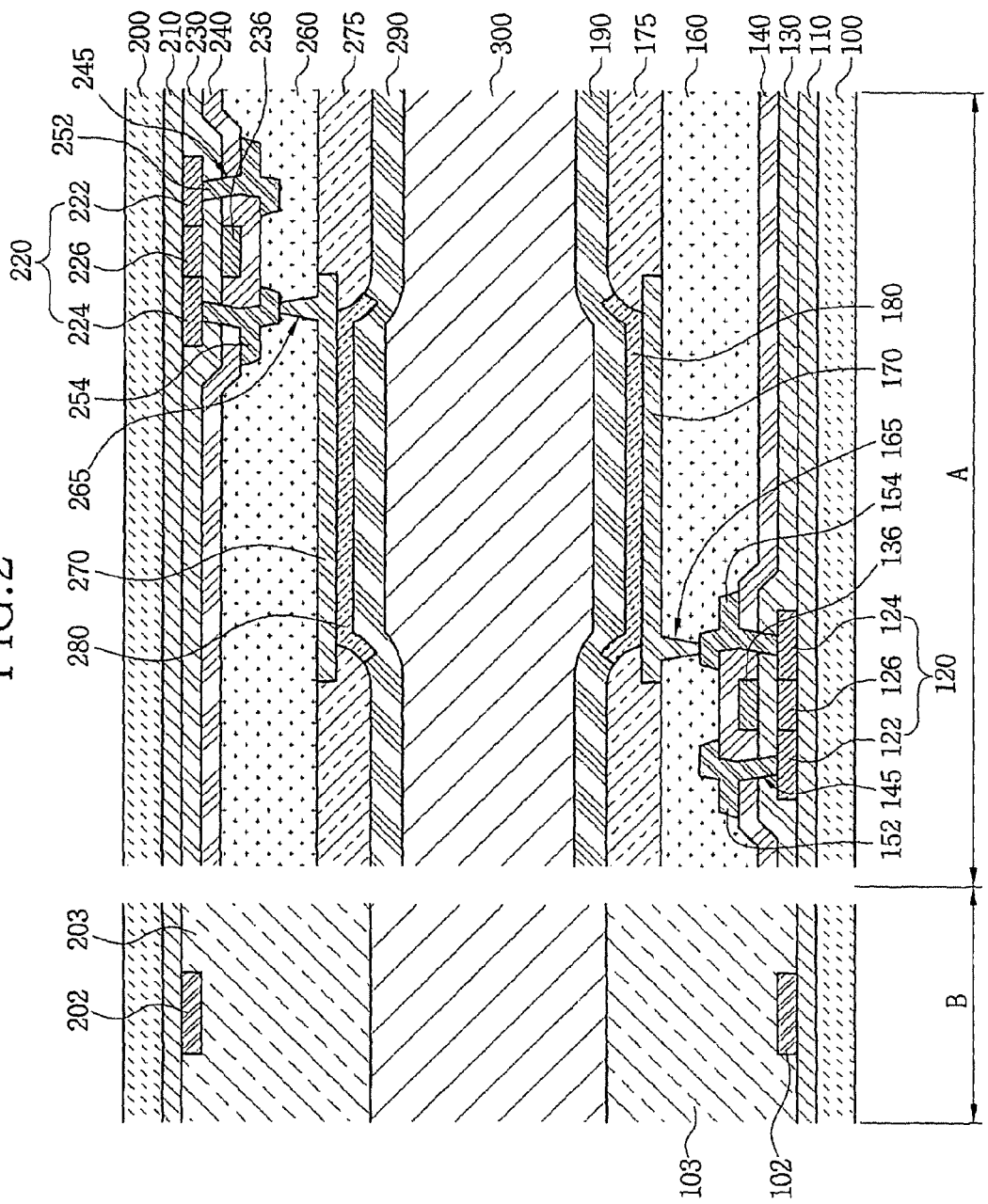
FIG. 2 is a detailed cross-sectional view of OLEDs in the OLED display device shown in FIG. 1.

FIG. 2 is a detailed cross-sectional view of OLEDs formed on first and second substrates in the double-emission OLED display device of FIG. 1. A method of fabricating an OLED display device will now be described with reference to FIGS. 1 and 2. A buffer layer 110 is formed on a first substrate 100. The first substrate may be formed of glass, synthetic resin, or stainless steel. Here, the buffer layer 110 may be formed of a silicon oxide ($SiO_2$) layer, a silicon nitride (SiNx) layer, or a combination thereof to prevent diffusion of impurities from the first substrate 100.

Afterwards, an amorphous silicon layer (not shown) is formed on the buffer layer 110, and crystallized into a polycrystalline silicon layer, which is then patterned to form a semiconductor layer 120. The semiconductor layer 120 is formed of polycrystalline silicon by crystallizing the amorphous silicon layer; however, aspects of the present invention are not limited thereto such that the semiconductor layer 120 may be formed of amorphous silicon.

In addition, a gate insulating layer 130 is formed of a silicon oxide ($SiO_2$) layer, a silicon nitride ($SiN_x$) layer, or a combination thereof on the first substrate 100 having the semiconductor layer 120, and a metal layer for a gate electrode (not shown) is formed in a single layer or multilayer structure using one selected from the group consisting of aluminum (Al), chromium (Cr), molybdenum (Mo) and an alloy thereof on the gate insulating layer 130. Then, the metal layer for a gate electrode is etched by photolithography to form a gate electrode 136 in a region corresponding to a specific region of the semiconductor layer 120. Source, drain, and channel regions 122, 124, and 126 are formed in the semiconductor layer 120 by doping the semiconductor layer 120 with n-type or p-type impurities using the gate electrode 136 as a mask. Here, the channel region 126 is a region of the semiconductor layer 120 corresponding to the gate electrode 136 and is not doped with the n-type or p-type impurities. However, aspects of the present invention are not limited thereto such that the impurity doping process for the semiconductor layer 120 may be performed using a photoresist before forming the gate electrode 136.

After the gate electrode 36 is formed, an interlayer insulating layer 140 is formed on the first substrate 100 having the gate electrode 136. The interlayer insulating layer 140 and the gate insulating layer 130 are etched to form contact holes 145 that partially expose the source and drain regions 122 and 124 of the semiconductor layer 120. Here, the interlayer insulating layer 140 may be a silicon oxide ($SiO_2$) layer, a silicon nitride (SiNx) layer, or a combination thereof.

Subsequently, a conductive material layer (not shown) is formed over the interlayer insulating layer 140 having the contact holes 145, and patterned to form source and drain electrodes 152 and 154, which are electrically connected to the source and drain regions 122 and 124 through the contact holes 145, respectively. Thus, a thin film transistor is completed. The conductive material layer may be formed of molybdenum tungsten (MoW), aluminum (Al), or an Al alloy, such as aluminum-neodymium (Al—Nd), which has high electron mobility.

Here, the gate electrode 136 of the thin film transistor is formed on the semiconductor layer 120; however, aspects of the present invention are not limited thereto such that the gate electrode 136 of the thin film transistor may be formed under the semiconductor layer 120, i.e., aspects of the present invention apply to both top-gate and bottom-gate thin film transistors.

Subsequently, a passivation layer 160 is formed on the first substrate 100 having the thin film transistor, and the passivation layer 160 is etched to form a via hole 165, which partially exposes the drain electrode 154 of the thin film transistor. While the drain electrode 154 of the thin film transistor is partially exposed through the via hole 165 in the present embodiment, aspects of the present invention are not limited thereto such that the source electrode 152 of the thin film transistor may be partially exposed through the via hole 165. Here, the passivation layer 160 may be an inorganic layer, such as a silicon oxide ($SiO_2$) layer, a silicon nitride ($SiN_x$) layer, or a combination thereof; an organic layer, e.g., formed of acryl; or a combination thereof.

Then, a conductive material layer (not shown) is formed on the passivation layer 160 and patterned to form a first lower electrode 170, which is electrically connected to the drain electrode 154 of the thin film transistor through the via hole 165. Here, the first lower electrode 170 is a conductive and transparent layer which may be formed of indium tin oxide (ITO) or indium zinc oxide (IZO) having a high work function.

Subsequently, a material for a pixel defining layer (not shown) is deposited on the first lower electrode 170 and etched to form a pixel defining layer 175 having an opening that partially exposes the first lower electrode 170. The pixel defining layer 175 may be formed of one selected from the group consisting of polyimide, benzocyclobutene series resin, phenol resin, and acrylate.

Then, a first organic layer 180 having at least one emission layer is formed on the first lower electrode 170 exposed through the opening of the pixel defining layer 175. Here, the first organic layer 180 may include at least one of red, green, and blue emission layers, and may further include a hole injection layer, a hole transport layer, an electron transport layer, an electron injection layer, an electron blocking layer, and a hole blocking layer. Further, each of the layers may be a single layer or may comprise multiple layers.

Subsequently, a first upper electrode 190 is formed on the first organic layer 180, and thus a first OLED 101 is completed. Here, when at least one interconnection 102 and an interconnection insulating layer 103 are formed in an interconnection region B of the first substrate 100, the at least one interconnection 102 may be formed of one of the semiconductor layer 120, the gate electrode 136, the source and drain electrodes 152 and 154, the first lower electrode 170 of the first OLED 101, and combinations thereof. The interconnection insulating layer 103 may be formed of one of the gate insulating layer 130, the interlayer insulating layer 140, the passivation layer 160, the pixel defining layer 175 of the first OLED 101, and combinations thereof.

After that, by the same method as the first OLED 101, a second OLED 201 is completed by forming a thin film transistor including a semiconductor layer 220, a gate insulating layer 230, a gate electrode 236, an interlayer insulating layer 240, and source and drain electrodes 252 and 254; a passivation layer 260 disposed on the thin film transistor; a second lower electrode 270 electrically connected to the drain electrode 254 of the thin film transistor through a via hole 265; a pixel defining layer 275, a second organic layer 280 including at least one emission layer; and a second upper electrode 290 on a second substrate 200. Further, a buffer layer 210 may be formed on the substrate 200, and the thin film transistor may be formed thereon. Similar to as described above, the semiconductor layer 220 is doped with n-type or p-type impurities to form source, drain, and channel regions 222, 224, and 226. The source and drain electrodes 252 and 254 are respectively electrically connected to the source and drain regions 222 and 224 of the semiconductor layer 220 through contact holes 245 formed in the interlayer insulating layer 240 and the gate insulating layer 230. A second interconnection 202 and an interconnection insulating layer 203 may be formed similarly to the first interconnection 102 and the interconnection insulating layer 103 as described above.

The second organic layer 280 having at least one emission layer is formed on the second lower electrode 270 exposed through the opening of the pixel defining layer 275. Here, the second organic layer 280 may include at least one of red, green, and blue emission layers, and may further include a hole injection layer, a hole transport layer, an electron transport layer, an electron injection layer, an electron blocking layer, and a hole blocking layer. Further, each of the layers may be a single layer or may comprise multiple layers.

Here, although an emission region A of the first OLED 101 is shown to overlap an emission region A of the second OLED 201, aspects of the present invention are not limited thereto such that an emission region A of the first OLED 101 may overlap a region between emission regions A of the second OLED 201, i.e., a non-emission region B of the second OLED 201. The first and second OLEDs 101 and 201 may include a plurality of emission regions.

Then, a space between the first and second substrates is filled with a solid conductive film, such as an anisotropic conductive film or a paste including metal or carbon conductive powder, and thereby the first upper electrode 190 of the first OLED 101 is electrically connected to the second upper electrode 290 of the second OLED 201. Here, a conductive layer may be formed between the first upper electrode 190 of the first OLED 101 and the second upper electrode 290 of the second OLED 201 by applying the conductive filler, i.e., the paste including metal or carbon powder, or attaching the solid conductive film, such as an anisotropic conductive film, to the first upper electrode 190 of the first OLED 101 or the second upper electrode 290 of the second OLED 201.

Subsequently, the first substrate 100 having the first OLED 101 and the second substrate 200 having the second OLED 201 are bonded to each other and to face each other using a sealant 400 disposed along edges of the first and second substrates 100 and, i.e., the thin film transistors disposed on the first and second substrates 100 and 200 are disposed between the first and second substrates 100 and 200. Thus, an OLED display device according to the exemplary embodiment of the present invention is completed.

As a result, in the OLED display device according to aspects of the present invention, breakage of the first and second OLEDs formed on the respective substrates due to external pressure applied to the first and second substrates in a vertical direction can be prevented by filling the space between the first and second substrates with the conductive filler or forming the conductive layer in the space between the first upper electrode of the first OLED formed on the first substrate and the second upper electrode of the second OLED formed on the second substrate facing the first substrate.

Further, the first upper electrode of the first OLED is electrically connected to the second upper electrode of the second OLED using the conductive layer or the conductive filler, and the same amount of voltage is applied to the first and second upper electrodes of the first and second OLEDs formed on the first and second substrates, respectively. Thus, an IR drop that occurs in a power voltage line commonly applied to the first and second OLEDs can be prevented.

According to aspects of the present invention, an OLED display device has a conductive layer between two OLEDs by filling a space between two substrates having the independently driven OLEDs with a conductive filler. Here, the conductive layer is in contact with upper electrodes of the OLEDs formed on the respective substrates. Accordingly, breakage of the OLEDs due to external pressure applied in a vertical direction to surfaces of the substrates can be prevented, and an IR drop of power voltage applied by the upper electrodes of the respective OLEDs can be reduced, and thus total power consumption can be decreased in the OLED display device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A double-emission organic light emitting diode (OLED) display device, comprising:
    a first substrate having a first display region for displaying a first image and a first interconnection region;
    a first OLED disposed on the first substrate and having at least one first emission layer;
    a conductive layer disposed on the first OLED;
    a second OLED disposed on the conductive layer and having at least one second emission layer; and
    a second substrate disposed on the second OLED, the second substrate having a second display region for displaying a second image and a second interconnection region.

2. The OLED display device of claim 1, wherein the first OLED comprises:
    a first lower electrode disposed between the first substrate and the first emission layer, and
    a first upper electrode disposed between the first emission layer and the conductive layer; and
    the second OLED comprises:
    a second lower electrode disposed between the second substrate and the second emission layer, and
    a second upper electrode disposed between the second emission layer and the conductive layer;
    wherein the first and second upper electrodes are electrically connected to the conductive layer.

3. The OLED display device of claim 2, wherein the first and second upper electrodes are formed of a same material.

4. The OLED display device of claim 2, further comprising:
    at least one thin film transistor disposed between the first substrate and the first lower electrode and/or between the second substrate and the second lower electrode.

5. The OLED display device of claim 1, wherein the first and second OLEDs each comprise at least one emission region, and the emission region of the first OLED overlaps with the emission region of the second OLED.

6. The OLED display device of claim 1, wherein the conductive layer is formed of a solid conductive film.

7. The OLED display device of claim 6, wherein the solid conductive film comprises an anisotropic conductive film (ACF).

8. The OLED display device of claim 1, wherein the conductive layer is formed of a paste comprising metal powder.

9. The OLED display device of claim 1, wherein the first OLED is driveable independent of the second OLED.

10. A double-emission organic light emitting diode (OLED) display device, comprising:
    a first substrate comprising a first OLED having at least one first emission layer, the first substrate having a first display region for displaying a first image and a first interconnection region;
    a second substrate bonded to the first substrate and comprising a second OLED having at least one second emission layer, the second substrate having a second display region for displaying a second image independent of the first image and a second interconnection region;
    a sealant disposed along edges of the first and second substrates to bind the first substrate to the second substrate; and
    a conductive filler disposed between the emission layers of the first and second substrates.

11. The OLED display device of claim 10, wherein the first OLED comprises:
    a first lower electrode disposed between the first substrate and the first emission layer, and
    a first upper electrode disposed between the first emission layer and the conductive filler; and
    the second OLED comprises:
    a second lower electrode disposed between the second substrate and the second emission layer, and
    a second upper electrode disposed between the second emission layer and the conductive filler;
    wherein the first and second upper electrodes are in contact with the conductive filler.

12. The OLED display device of claim 11, wherein the first and second upper electrodes are formed of a same material.

13. The OLED display device of claim 11, further comprising:
    at least one thin film transistor disposed between the first substrate and the first lower electrode and/or between the second substrate and the second lower electrode.

14. The OLED display device of claim 10, further comprising:
    a first interconnection disposed on the first interconnection region of the first substrate, between the sealant and the first OLED;
    a second interconnection disposed on the second interconnection region of the second Substrate, between the sealant and the second OLED;
    a first interconnection insulating layer disposed between the first interconnection and the conductive filler; and
    a second interconnection insulating layer disposed between the second interconnection and the conductive filler.

15. The OLED display device of claim 14, further comprising:
    a first thin film transistor disposed between the first substrate and the first OLED; and
    a second thin film transistor disposed between the second substrate and the second OLED,
    wherein the first and second interconnections are formed of the same material one of a semiconductor layer, a gate electrode, a source electrode, a drain electrode of the thin film transistor, and a combination thereof.

16. The OLED display device of claim 14, wherein each interconnection insulating layer is one selected from a group consisting of a gate insulating layer and an interlayer insulating layer of the thin film transistor, a passivation layer disposed on the thin film transistor, and a combination thereof.

17. The OLED display device of claim 14, further comprising:

first and second absorption layers disposed between the first and second interconnection insulating layers and the conductive filler, respectively.

18. The OLED display device of claim 10, wherein the conductive filler comprises a metal powder.

19. The OLED display device of claim 10, wherein the conductive filler comprises an anisotropic conductive film.

20. The OLED display device of claim 10, wherein the first and second OLEDs each comprise at least one emission region, and the emission region of the first OLED overlaps the emission region of the second OLED.

21. A double-emission organic light emitting diode (OLED) display device, comprising:
    first and second substrates coupled together, each of the first and second substrates having disposed thereon an OLED having a first electrode connected to a thin film transistor, a second electrode, and an emission layer disposed between the first and second electrodes of the OLED;
    the first substrate having a first display region for displaying a first image and a first interconnection region; and
    the second substrate having a second display region for displaying a second image independent of the first image and a second interconnection region,
    wherein the second electrodes are electrically connected to each other.

22. The OLED display device of claim 21, further comprising:
    a conductive filler to electrically connect the second electrodes.

23. The OLED display device of claim 22, wherein the conductive filler comprises a metal powder.

24. The OLED display device of claim 22, wherein the conductive filler comprises an anisotropic conductive film.

* * * * *